US009042582B2

(12) United States Patent
Chan et al.

(10) Patent No.: US 9,042,582 B2
(45) Date of Patent: May 26, 2015

(54) COAXIAL PASSIVE RADIATION MONOMER

(71) Applicant: Plastoform Industries Limited, Hong Kong (CN)

(72) Inventors: Matthew Chi-Hung Chan, Hong Kong (CN); Kin-Man Tse, Hong Kong (CN)

( * ) Notice: Subject to any disclaimer, the term of this patent is extended or adjusted under 35 U.S.C. 154(b) by 0 days.

(21) Appl. No.: 13/733,040

(22) Filed: Jan. 2, 2013

(65) Prior Publication Data

US 2014/0185838 A1 Jul. 3, 2014

(51) Int. Cl.
*H04R 25/00* (2006.01)
*H04R 1/02* (2006.01)
*H05K 5/00* (2006.01)

(52) U.S. Cl.
CPC ...................................... *H04R 1/021* (2013.01)

(58) Field of Classification Search
USPC ......... 381/152, 337, 345, 346, 349, 186, 404, 381/423, 86, 302, 71.4, 365, 389; 181/150
See application file for complete search history.

(56) References Cited

U.S. PATENT DOCUMENTS 3,772,466 A * 11/1973 Hossbach ..................... 381/184
4,379,951 A * 4/1983 Gabr ............................. 381/431
5,687,247 A * 11/1997 Proni ............................ 381/398

* cited by examiner

*Primary Examiner* — Curtis Kuntz
*Assistant Examiner* — Sunita Joshi
(74) *Attorney, Agent, or Firm* — Sonya C. Harris; Invention Services Gaff Myer IPS

(57) ABSTRACT

A coaxial passive radiation monomer apparatus is disclosed. In accordance with an aspect of the present disclosure, there is disclosed a dynamic speaker monomer combined with a passive radiator in a single unitary structure located in spatial proximity with respect to one another to thereby and further comprising an elastic material at the base of the speaker assembly for enhanced and optimized resonance frequencies for the active and passive components of the overall device.

7 Claims, 3 Drawing Sheets

A-A

COAXIAL PASSIVE RADIATION MONOMER

FIELD OF INVENTION

The present disclosure relates generally to an acoustic radiator that includes an audio speaker and passive radiator mounted in the same enclosure, and more specifically to a structure wherein they are mounted coaxially.

BACKGROUND

Loudspeakers or speakers transform electrical signals into acoustical energy. Many loudspeakers have a transducer, sometimes referred to as an active driver, a driver, or a passive radiator, mounted in a speaker enclosure. The speaker enclosure may have a box-like configuration with sides and a back enclosing the transducer. The speaker enclosure may have other shapes and configurations including those that conform to environmental conditions of the loudspeaker location, such as in a vehicle. The transducer may provide a full range of acoustical frequencies from low to high. The transducer may provide a particular range of acoustical frequencies, such as low frequencies and/or midrange frequencies. Many loudspeakers have multiple transducers and/or a combination of transducers in the speaker enclosure. When multiple transducers are utilized in the speaker enclosure, it is common for individual transducers to operate in different frequency bands.

A transducer generally may have a cone connected along its outer perimeter to a frame by a surround. The cone may be made of paper, polymer, metal, ceramic, composites, and the like. The frame may be made of metal or other rigid material. The surround may be made of an elastomer like foam rubber, a doped cloth, or other pliable material and can contribute to isolating the cone from the frame. The cone is connected along its inner perimeter to a former, which is wrapped with insulated wire to form a voice coil. The voice coil generally is positioned within the magnetic gap of a magnetic field generated by one or more permanent magnets and may move in a linear fashion inside the magnetic field. The motor structure, generally including one or more permanent magnets, may be attached to the frame. When an electric potential or voltage is passed through the voice coil, the wire windings of the voice coil generate an electromagnetic field that interacts with the magnetic field of the one or more permanent magnets. This magnetic interaction results in a force being applied to the voice coil. This force moves the former, causing the cone to vibrate or oscillate. This vibration or oscillation of the cone can produce acoustical energy, such as a sound wave.

Low frequency transducers ("woofer"), midrange frequency transducers ("midrange"), and high frequency transducers ("tweeter") generally produce less acoustical energy as the frequency decreases. Woofers and midranges generally may have a cutoff frequency where the acoustical energy drops about 3 dB below the average energy produced by a given transducer. At frequencies below the cutoff frequency, the acoustical energy produced by the transducer generally decreases rapidly.

A speaker system that includes a transducer, such as a woofer and/or a midrange, may be equipped with a bass-reflex device, such as a vent, port, or passive radiator, to extend the low frequency (bass) response of the system. A bass-reflex device can be tuned or configured to operate at or below the cutoff frequency for the transducer. This resonance of the bass-reflex device may contribute to the total acoustical output of the loudspeaker by extending the low frequency output below that of a sealed system. A loudspeaker with a bass-reflex device may have an extended bass response, thus allowing it to produce lower frequencies than a sealed system with a similar transducer arrangement. A bass-reflex device often is located on the same side of the loudspeaker enclosure as the transducer. The bass-reflex device also may be located on other sides of the loudspeaker enclosure.

A bass-reflex device generally uses the acoustical energy or air pressure generated within an enclosure to extend the low frequency response of the system. When the voice coil of a transducer moves in the magnetic gap, the former may move the cone toward the interior of the enclosure. This movement generates an acoustical wave in the interior of the enclosure. This acoustical wave cannot emanate from the loudspeaker if the enclosure is sealed. The acoustical energy associated with this acoustical wave generated within the enclosure generally is "lost" in the loudspeaker enclosure. A bass-reflex device can use this acoustical energy to resonate below and/or at the cutoff frequency of the transducer.

Some loudspeakers use a port as the bass-reflex device. A port may be a tube-like opening in the speaker enclosure. The port generally is "tuned"—sized and configured—to resonate the air column within the port at a frequency at and/or below the cutoff frequency of the transducer. The air column within the port resonates in response to acoustical energy generated within the enclosure. The resonance frequency of the air in the port may be limited by the available air volume in the speaker enclosure and is often difficult to control. Other loudspeakers may use a passive radiator as the bass-reflex device. A passive radiator generally is a rigid body mounted within an opening in the speaker enclosure. The rigid body is connected to the speaker enclosure by a surround. The rigid body may be made of paper, polymer, metal, composites, or other noncompliant materials. The surround generally is made of foam rubber, doped cloth, an elastomer, or other pliable material.

A passive radiator translates the air pressure created by the transducer into movement or resonance of the rigid body within the surround. The resonance of the rigid body can generate acoustical energy at a frequency below the cutoff frequency of the transducer. The mass and compliance of the rigid body can control the resonance frequency of the passive radiator. The rigid body may have a conic, flat, or other shape. A passive radiator may look like another "transducer" except without the voice coil, magnet, and related components. In some applications, such as vehicle and in-wall mounting, there may be little or no available space for a transducer and a passive radiator in the speaker enclosure to perform at the highest efficiency, and having a cost-effective design.

SUMMARY

The present invention addresses the above-described deficiencies and others. Specifically, the present invention provides a cost effective design for a coaxial speaker apparatus.

In accordance with an aspect of the present disclosure, there is disclosed a dynamic speaker combined with a passive radiator in a single unitary structure.

In accordance with another aspect of the present disclosure, there is disclosed a dynamic speaker combined with a passive radiator in a single unitary structure in a high efficiency coaxial configuration.

In accordance with another aspect of the present disclosure, there is disclosed a dynamic speaker combined with a passive radiator in a single unitary structure in a high efficiency coaxial configuration that greatly decreases manufacturing costs and has an effectively smaller overall dimension, volume and size of the speaker assembly, thus achieving miniaturization.

In accordance with another aspect of the present disclosure, there is disclosed a dynamic speaker monomer combined with a passive radiator in a single unitary structure located in spatial proximity with respect to one another to thereby affect the vibration impedance of the passive radiator to facilitate low-frequency responses.

In accordance with another aspect of the present disclosure, there is disclosed a dynamic speaker combined with a passive radiator in a single unitary structure and further comprising a elastic material at the base of the speaker assembly for enhanced and optimized resonance frequencies for the active and passive components of the overall device.

In the description herein, numerous specific details are provided, such as examples of components and/or methods, to provide a thorough understanding of embodiments of the present invention. One skilled in the relevant art will recognize, however, that an embodiment of the invention can be practiced without one or more of the specific details, or with other apparatus, systems, assemblies, methods, components, materials, parts, and/or the like. In other instances, well-known structures, materials, or operations are not specifically shown or described in detail to avoid obscuring aspects of embodiments of the present invention.

BRIEF DESCRIPTION OF THE DRAWINGS

Embodiments of the present disclosure are described herein with reference to the drawings, in which.

The novel features which are characteristic of the invention, as to organization and method of use, together with further objects and advantages thereof, will be better understood from the following disclosure considered in connection with the accompanying drawings in which one or more preferred embodiments of the invention are illustrated by way of example. It is to be expressly understood, however, that the drawings are for the purpose of illustration and description only and are not intended as a definition of the limits of the invention.

As used herein, the term "comprises" refers to a part or parts of a whole, but does not exclude other parts. That is, the term "comprises" is open language that requires the presence of the recited element or structure or its equivalent, but does not exclude the presence of other elements or structures. The term "comprises" has the same meaning and is interchangeable with the terms "includes" and "has". The term set has the meaning of one or more of said element. Furthermore, any use of the term "or" as used herein is generally intended to mean "and/or" unless otherwise indicated. Combinations of components or steps will also be considered as being noted, where terminology is foreseen as rendering the ability to separate or combine is unclear.

DETAILED DESCRIPTION

Figure 1:
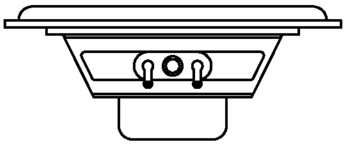
FIG 1 PRIOR ART
FIG. 1 is a diagram of as side view of a conventional loudspeaker device known in the prior art.

FIG. 1 is a depiction of a side diagrammatic view of a prior art active loudspeaker 10 known in the art.

Referring now to FIGS. 2-5, wherein the coaxial passive radiation monomer of the present invention is illustrated. As shown in the appending figures, the present invention discloses an active loudspeaker assembly having both the active and passive radiators in a solitary device and further having the advantage of enabling the necessary piston movement with an additional elastic structure strategically configured with relation to the active and passive components of the radiator.

Figure 2:
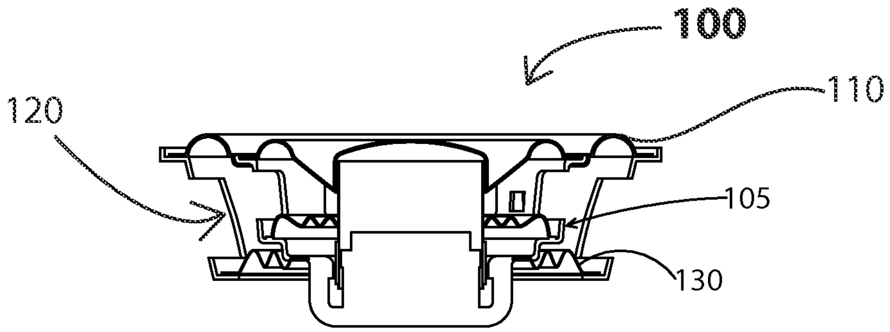
FIG. 2 is a side cross-sectional view of the Coaxial Passive Radiation Monomer, in accordance with an embodiment of the present invention.

FIG. 2 is a side diagrammatic cross-sectional view of the Coaxial Passive Radiation Monomer (CPRM) 100 of the instant invention. The CPRM 100 is comprised of three major components being the Passive Radiator (PR) 110, the Active Radiator (AR) 120 and the elastic membrane (EM) 130. The CPRM 100 may be at least partially mounted in a support mechanism 105, shown in phantom in FIG. 4. A support mechanism 105 commonly comprises a speaker enclosure, which provides a substantially sealed enclosure around both the AR 120 and PR 110, and for this invention, at least partially enclosing the elastic membrane 130 also. The speaker enclosure may have additional transducers and/or passive radiators. Moreover, in other embodiments the speaker enclosure may also include different types of transducers, and may have other shapes such as rectangular and oval. A rectangular shape includes a square and other polygons. An oval shape includes a cylinder, an elliptical configuration, and other curvaceous shapes. One or more of the sides may be flat or curvilinear. One or more of the sides may be omitted and may be provided by the environment in which the CPRM 100 is placed. In an in-wall speaker installation, the wall or wall framing could provide one or more of the sides. In a vehicle speaker installation, the vehicle body or frame could provide one or more of the sides. The support mechanism 105 may have other configurations including those with fewer, and additional components. The support mechanism 105 may be made from a polymer, metal, composites, combinations thereof, or other materials.

Figure 3:
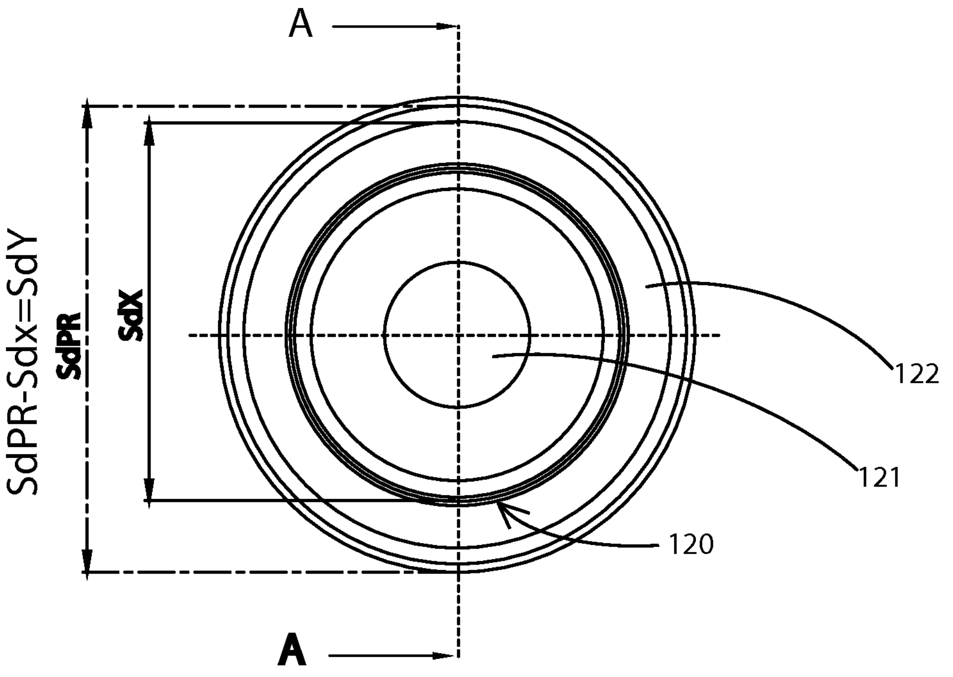
FIG. 3 is front elevational view of the Coaxial Passive Radiation Monomer, according to the present disclosure.
Figure 4:
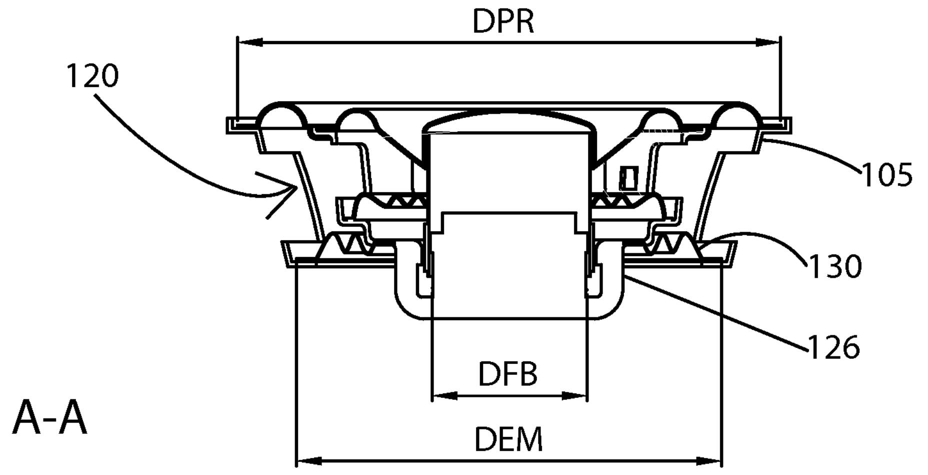
FIG. 4 is a side view of the Coaxial Passive Radiation Monomer with an exemplary speaker enclosure, in accordance with an embodiment of the present invention.
Figure 5:
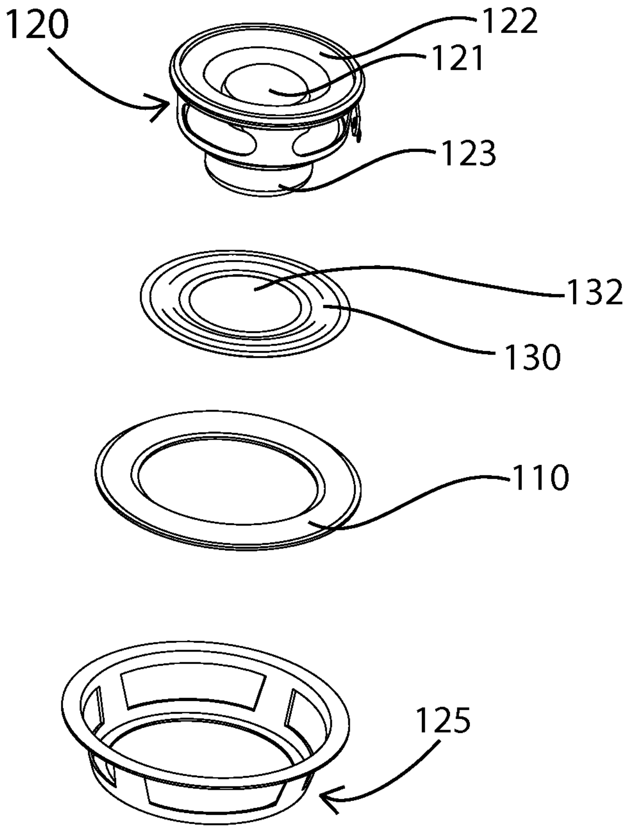
FIG. 5 is an exploded view of the Coaxial Passive Radiation Monomer, according to certain embodiments of the present disclosure.

Referring to FIGS. 3-5, FIG. 3 is a top perspective view of the CPRM 100. FIG. 4 is a side diagrammatic view of the CPRM 100. FIG. 5 is an exploded view of the CPRM 100, illustrating the spatial relationships between major components PR 110, AR 120 and elastic membrane 130, and their respective elements. The AR 120 is shown to include conventional elements for a loudspeaker transducer known to those of ordinary skill in the art such as a cap, dynamic surround structure, cone structure, voice coil, magnets, motor structure, terminals and a frame structure. The frame structure 125 may include a frame base 126 which is configured for operatively and mechanically coupling with the elastic membrane 130. The elastic membrane 130 may contain a groove or recess 132 for receiving the distal portion of the frame base to facilitate mechanical and operative coupling with the proximal portion of the elastic membrane 130. In some embodiment, however, a bonding agent suitable for acoustic coupling may also be used.

AR 120 is comprised of a transducer, being an electromechanical air moving device that generates acoustical energy from electrical signals. The AR 120 has a cone 123, which encases traditional active loudspeaker components including a voice coil wrapped around a former. The voice coil is positioned within the magnetic gap of a magnet. When an electric potential is applied to the voice coil, the wire windings generate an electromagnetic field that moves the former. This movement causes the cone to vibrate or oscillate, thus producing acoustical energy. The cone 123 may be made of paper such as a felted paper fiber, a polymer such as polypropylene, a metal such as aluminum, a ceramic, a composite of these or other materials, or another suitable material. The voice coil may have a single or dual coil design. The voice coil may comprise, for example, a single coil of about 60 feet of copper ribbon wire. The voice coil may have other configurations including those with different dimensions and materials. The cone 123 is connected to the active radiator surround 122, which is connected to a transducer frame 125.

The active radiator surround 122 may be comprised of an elastomeric like foam rubber, a doped cloth, or other pliable material. The active radiator surround 122 does not let air pass through it. The transducer frame 125 extends along the outside of the cone 123 and connects with the magnet. The transducer frame 125 has one or more holes or apertures disposed along the perimeter adjacent to the active radiator surround 122. AR 120 is mounted directly on the elastic membrane 130. The transducer frame 125 and the elastic membrane 130 may form a single component in certain embodiments. The elastic membrane 130 may likewise be comprised of an elastomeric like foam rubber, a doped cloth, or other pliable material that will allow for desired acoustical push-pull, piston movement, however slight, at the base of the CPRM 100. The material of the elastic membrane 130 is selected to be a semi rigid mass that could be made of a soft rubber or similar material that has the selected necessary resilience for the desired transverse displacement range, and provide stability against unwarranted movement of PR 110. The AR 120 may provide a partial or full range of acoustical frequencies audible to the human ear. The CPRM 100 may provide a specific range of frequencies such as low or midrange frequencies. During operation, the electro-magnetic motor components of the AR 120 expands and contracts as the signal is applied to the voice coil changes. This results in compression and tension, and is further related to the material and structure of the elastic membrane 130, in as much as it is essentially a shock absorber facilitating and optimizing resonance frequencies for the active and passive operation of the components. The flexibility and pliability of the elastic membrane 130 in conjunction with the configured size and dimension (e.g., circumferential diameter) are all critical to the weight of the moving parts of the AR 120, and the frequency range of the AR 120.

There is a direct structural and functional relationship between the arrangement, dimension, and configuration of the three major components 110, 120 and 130. As can be gleaned in the figures, the PR 110 is integrated with the AR 120, such that the PR 110 concentrically surrounds the AR 120, and further such that the diameter of the elastic membrane 130 extends beyond that of the frame base.

This can be expressed by the following:

$$SdPR=Sdx+Sdy$$

$SdPR \leq 2.5 \times Sdx$, therefore, it follows that $$SdPR \leq Sdx+Sdy$$

wherein,

Sdx is the vibration area of the AR, Sd is the surface dimension;

Sdy is the external vibration area of the CPRM,

SdPR is the vibration area of the PR;

See also FIG. 3.

In operation, the PR 110 resonates in response to the acoustical energy generated within the AR 120. The PR 110 resonates at a resonance frequency below the cutoff frequency of the AR 120. The AR 120 may have an amplifier (not shown) and/or may have other configurations including those with fewer or additional components, as known in the art. The mass of the passive radiator 110 (MassPR), is equal to the mass of the active radiator 120 (MassAR) plus the mass of the active radiator surround 122 (MassSurround); therefore $$(MassPR)=(MassAR)+(MassSurround).$$

It is also to be noted that the ratio of the circumferential diameter of the elastic membrane 130 (Dem) is approximately half of the diameter of the frame base 126 (Dfb):

$$Dfb \approx \tfrac{1}{2}Dem, \text{ and also, } Dpr \leq Dem$$

The circumferential diameter of the PR 110 (Dpr)>Dfb; and (Dpr)>Dem

See also FIG. 4.

It is to be appreciated that one or more of the elements depicted in the drawings/figures can also be implemented in a more separated or integrated manner, or even removed or rendered as inoperable in certain cases, as is useful in accordance with a particular application. It is also within the spirit and scope of the present invention to implement a program or code that can be stored in a machine-readable medium to permit a computer to perform or assist with any of the methods and procedures described herein.

Thus, while the present invention has been described herein with reference to particular embodiments thereof, a latitude of modification, various changes and substitutions are intended in the foregoing disclosures, and it will be appreciated that in some instances some features of embodiments of the invention will be employed without a corresponding use of other features without departing from the scope and spirit of the invention as set forth. Therefore, many modifications may be made to adapt a particular situation or material to the essential scope and spirit of the present invention. It is intended that the invention not be limited to the particular terms used and/or to the particular embodiment disclosed as the best mode contemplated for carrying out this invention, but that the invention will include any and all embodiments and equivalents falling within the scope of the instant disclosure.

The foregoing description of illustrated embodiments of the present invention, including what is described in the Abstract, is not intended to be exhaustive or to limit the invention to the precise forms disclosed herein. While specific embodiments of, and examples for, the invention are described herein for illustrative purposes only, various equivalent modifications are possible within the spirit and scope of the present invention, as those skilled in the relevant art will recognize and appreciate. As indicated, these modifications may be made to the present invention in light of the foregoing description of illustrated embodiments of the present invention and are to be included within the spirit and scope of the present invention.

What is claimed is:

1. A coaxial passive radiation monomer comprising:

a passive radiator comprising a flexible surround mounting, an active radiator transducer assembly having an active audio loudspeaker driver components for converting electrical energy to sound waves, and an active radiator surround mounting for actively radiating sound waves, and a frame support member for encasing and housing said active audio loudspeaker driver components, and operatively supporting said passive radiator and wherein said passive radiator is located circumferentially about said active radiator transducer assembly; and an elastic membrane located circumferentially adjacent said frame support member and operatively connected to said frame support member for optimizing resonance frequencies for both the active radiator transducer and the passive radiator: and a support mechanism encasing and containing said active radiator transducer assembly, said active audio loudspeaker driver components, and said elastic membrane;

and wherein the elastic membrane has a circumferential diameter that is approximately half the diameter of the frame support member; and wherein said support member encases and contains both said active radiator transducer and said passive radiator;

and the mass of said passive radiator equals the same of the mass of the active radiator and the active radiator surround mounting.

2. The coaxial passive radiation monomer of claim 1, wherein said support member has an upper proximal end, and a lower distal end; and wherein the circumferential diameter of the upper proximal end is greater than the circumferential diameter of the lower distal end.

3. The coaxial passive radiation monomer of claim 2, wherein said elastic membrane is operatively connected to, and located at, the distal end of said frame support member; and said active radiator transducer assembly is housed within a proximal end of said frame support member.

4. The coaxial passive radiation monomer of claim 3, wherein the circumferential diameter of said passive radiator is larger than the diameter of said active radiator surround mounting such that the vibration area of said passive radiator is greater than the vibration area of the active radiator surround.

5. The coaxial passive radiation monomer of claim 4, wherein the elastic membrane contains a receiving area for operatively coupling to said frame support member.

6. The coaxial passive radiation monomer of claim 5, wherein said receiving area contains a groove.

7. The coaxial passive radiation monomer of claim 6, wherein said receiving area is formed with a bonding agent for mechanical operative coupling to said frame support member.

* * * * *